United States Patent
Furuta et al.

(10) Patent No.: US 9,713,267 B2
(45) Date of Patent: Jul. 18, 2017

(54) METHOD FOR MANUFACTURING PRINTED WIRING BOARD WITH CONDUCTIVE POST AND PRINTED WIRING BOARD WITH CONDUCTIVE POST

(71) Applicant: IBIDEN CO., LTD., Ogaki-shi (JP)

(72) Inventors: Toru Furuta, Ogaki (JP); Takeshi Furusawa, Ogaki (JP); Tomoya Terakura, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/674,301

(22) Filed: Mar. 31, 2015

(65) Prior Publication Data

US 2015/0282314 A1    Oct. 1, 2015

(30) Foreign Application Priority Data

Mar. 31, 2014  (JP) .................................. 2014-073189

(51) Int. Cl.
*H05K 1/11* (2006.01)
*H05K 3/40* (2006.01)
(Continued)

(52) U.S. Cl.
CPC ........... *H05K 3/4007* (2013.01); *H05K 1/111* (2013.01); *H05K 1/0271* (2013.01);
(Continued)

(58) Field of Classification Search
CPC .......... H05K 1/11; H05K 1/111; H05K 1/115; H05K 1/117; H05K 3/4015;
(Continued)

(56) References Cited

U.S. PATENT DOCUMENTS

| | | | | |
|---|---|---|---|---|
| 5,843,806 A | * | 12/1998 | Tsai | ...................... H01L 21/486 257/E23.055 |
| 6,418,615 B1 | * | 7/2002 | Rokugawa et al. | .......................... H01L 23/49811 257/E23.068 |
| 2005/0280130 A1 | * | 12/2005 | Nakai | ..................... C23C 18/54 257/678 |
| 2007/0145584 A1 | * | 6/2007 | Kataoka et al. | ......... C25D 5/02 257/736 |

(Continued)

FOREIGN PATENT DOCUMENTS

| | | |
|---|---|---|
| JP | 10-173316 A | 6/1998 |
| JP | 2004-311804 A | 11/2004 |

*Primary Examiner* — Chau N Nguyen
*Assistant Examiner* — Roshn Varghese
(74) *Attorney, Agent, or Firm* — Oblon, McClelland, Maier & Neustadt, L.L.P.

(57) ABSTRACT

A method for manufacturing a printed wiring board with conductive posts includes forming on a first foil provided on carrier a first conductive layer including mounting pattern to connect electronic component via conductive posts, forming on the first foil a laminate including an insulating layer and a second foil to form the laminate on the first conductive layer, removing the carrier, forming a metal film on the laminate and first film, forming resist on the metal film to have pattern exposing portion of the metal film corresponding to the mounting pattern and portion of the second foil for a second conductive layer, forming an electroplating layer on the portion of the metal film not covered by the resist, removing the resist, and applying etching to remove the first and second foils below the metal film exposed by the removing the resist and to form the posts on the mounting pattern.

20 Claims, 7 Drawing Sheets

(51) Int. Cl.
  *H05K 1/02* (2006.01)
  *H05K 3/00* (2006.01)
  *H05K 3/28* (2006.01)
  *H05K 3/34* (2006.01)

(52) U.S. Cl.
  CPC .......... *H05K 3/0097* (2013.01); *H05K 3/282* (2013.01); *H05K 3/3436* (2013.01); *H05K 2201/0355* (2013.01); *H05K 2201/0376* (2013.01); *H05K 2201/09745* (2013.01); *H05K 2201/09772* (2013.01); *H05K 2203/0369* (2013.01); *H05K 2203/1536* (2013.01); *Y02P 70/611* (2015.11); *Y10T 29/49165* (2015.01)

(58) Field of Classification Search
  CPC .......... H05K 2201/09472; H05K 2201/09427; H05K 2201/09736; H05K 2201/0338; H05K 2201/0989; H05K 3/244; H01L 23/49822
  See application file for complete search history.

(56) References Cited

U.S. PATENT DOCUMENTS

| | | | |
|---|---|---|---|
| 2007/0243404 A1* | 10/2007 | Lin | B32B 17/06 428/630 |
| 2008/0179740 A1* | 7/2008 | Liao | H01L 23/49816 257/738 |
| 2009/0145645 A1* | 6/2009 | Kwon et al. | H01L 21/4853 174/260 |
| 2010/0084163 A1* | 4/2010 | Kodani | H01L 21/4846 174/250 |
| 2011/0061906 A1* | 3/2011 | Cho | H05K 1/0271 174/257 |
| 2011/0284269 A1* | 11/2011 | Maeda | H05K 1/113 174/251 |
| 2012/0031648 A1* | 2/2012 | Ebe | C25D 5/10 174/250 |
| 2014/0008814 A1* | 1/2014 | Chen | H05K 3/4007 438/622 |

* cited by examiner

METHOD FOR MANUFACTURING PRINTED WIRING BOARD WITH CONDUCTIVE POST AND PRINTED WIRING BOARD WITH CONDUCTIVE POST

CROSS-REFERENCE TO RELATED APPLICATIONS

The present application is based upon and claims the benefit of priority to Japanese Patent Application No. 2014-073189, filed Mar. 31, 2014, the entire contents of which are incorporated herein by reference.

BACKGROUND OF THE INVENTION

Field of the Invention

The present invention relates to a method for manufacturing a printed wiring board with a conductive post and to a printed wiring board with a conductive post. In particular, the present invention relates to a printed wiring board having a conductive layer embedded in a resin insulating layer and to a method of manufacturing the printed wiring board.

Description of Background Art

Japanese Patent Laid-open Publication No. H10-173316, for example, describes a method for manufacturing a wiring board in which a metal layer is applied to one surface of a resin film and the metal layer is patterned so as to have a predetermined pattern, after which an insulating sheet is pressed onto the metal layer. As a result, the metal layer is embedded in the insulating sheet, after which the resin film is peeled away from the insulating sheet.

Japanese Patent Laid-open Publication No. 2004-311804 describes a wiring board in which, with a metal release layer sandwiched therebetween, a conductor pattern is formed on a surface of copper foil, and the conductor pattern is tightly adhered to one surface of an insulating material and is subjected to pressure and heat, thereby embedding the conductor pattern near the surface of the insulating material. In this wiring board, after embedding the conductor pattern, a conductor pattern is also formed on the other surface of the insulating material using electroplating or etching.

The entire contents of these publications are incorporated herein by reference.

SUMMARY OF THE INVENTION

According to one aspect of the present invention, a method for manufacturing a printed wiring board with conductive posts includes forming a first conductive layer on a first metallic foil provided on a carrier such that the first conductive layer includes a mounting pattern positioned to connect an electronic component via conductive posts, forming on the first metallic foil a laminate structure including a resin insulating layer and a second metallic foil such that the laminate structure is formed on the first conductive layer, forming a hole for a via conductor through the laminate structure such that the hole exposes the first conductive layer, removing the carrier from the first metallic foil such that the first metallic foil is exposed, forming a metal film on the laminate structure and the first metallic film such that the metal film is formed on the first metallic foil, on the second metallic foil and inside the hole, forming a plating resist film on the metal film such that the plating resist film has a pattern exposing portion of the metal film substantially corresponding to the mounting pattern, the hole and portion of the second metallic foil for forming a second conductive layer on the resin insulating film, applying electroplating on the portion of the metal film exposed by the pattern of the plating resist film such that an electroplating conductive layer is formed on the portion of the metal film not covered by the plating resist film, removing the plating resist film from the metal film such that portion of the metal film below the plating resist film are exposed, and applying etching removal on the portion of the metal film exposed by the removing of the plating resist film such that portion of the first metallic foil and second metallic foil below the portion of the metal film exposed by the removing of the plating resist film is removed and that the conductive posts is formed on the mounting pattern.

According to another aspect of the present invention, a printed wiring board with conductive posts includes a resin insulating layer, a first conductive layer embedded into a first surface of the resin insulating layer such that the first conductive layer has an uppermost surface exposed on the first surface of the resin insulating layer and includes a mounting pattern formed to be electrically connected to an electronic component having electrodes, a second conductive layer formed on a second surface of the resin insulating layer on the opposite side of the resin insulating layer with respect to the first surface, a via conductor formed through the resin insulating layer such that the via conductor is electrically connecting the first conductive layer and the second conductive layer, a solder-resist layer formed on the first surface of the resin insulating layer such that the solder-resist layer is formed on the first conductive layer and has opening portions extending to portions of the first conductive layer, and conductive posts formed in the opening portions of the solder-resist layer such that the conductive posts are positioned to connect the first conductive layer to the electrodes of the electronic component and are protruding from the first surface of the resin insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
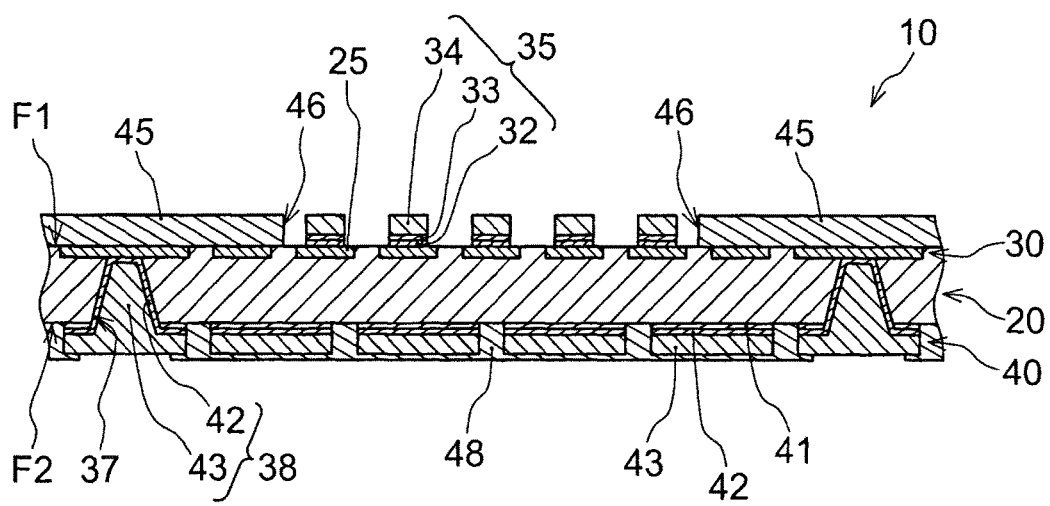
FIG. 1 is a cross-sectional view of a printed wiring board with conductive posts according to a first embodiment of the present invention manufactured using a method for manufacturing a printed wiring board with conductive posts according to the first embodiment of the present invention.

The embodiments will now be described with reference to the accompanying drawings, wherein like reference numerals designate corresponding or identical elements throughout the various drawings.

In the following, a printed wiring board with a conductive post according to a first embodiment of the present invention is described with reference to the drawings. As shown in FIG. 1, a printed wiring board (10) with a conductive post according to a first embodiment of the present invention (hereafter, the printed wiring board with the conductive post is referred to simply as a wiring board) includes a resin insulating layer (20) having a first surface (F1) and a second surface (F2) on an opposite side from the first surface (F1); a first conductive layer (30) embedded into the first surface (F1) of the resin insulating layer (20) such that an uppermost surface is exposed; a second conductive layer (40) formed on the second surface (F2) of the resin insulating layer (20); a via conductor (38) provided running through the resin insulating layer (20) and electrically connecting the first conductive layer (30) with the second conductive layer (40); and a solder-resist (45) formed on the first surface (F1) of the resin insulating layer (20) and on the first conductive layer (30).

An opening (46) is provided to the solder-resist (45). A conductive post (35), which is connected to an electrode (110) (see FIG. 2) of an electronic component (100) (see FIG. 2) mounted on the wiring board (10), is exposed through the solder-resist (45) by the opening (46). A mounting pattern (25) of the first conductive layer (30) is electrically connected to the electrode (110) of the electronic component (100) via the conductive post (35).

Figure 2:
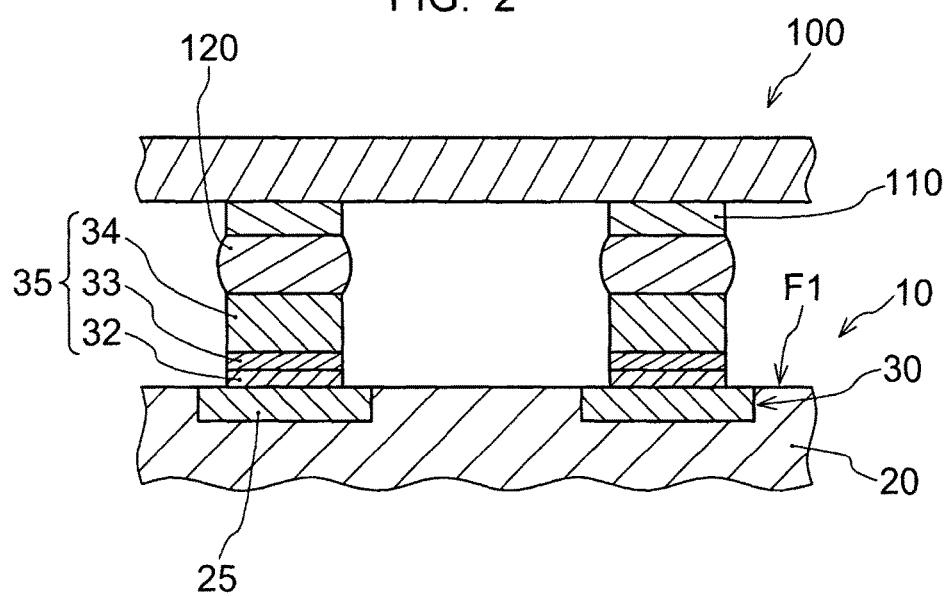
FIG. 2 is an expanded cross-sectional view of the conductive post of the printed wiring board shown in FIG. 1 and an electrode portion of an electronic component connected to the conductive post.

As shown in FIG. 2, a metal layer (32) is formed on top of the mounting pattern (25) of the first conductive layer (30), and a first metallic film (33) and second metallic film (34) are laminated in order on top of the metal layer (32). Moreover, FIG. 2 illustrates a state in which the electrode (110) of the electronic component (100) mounted to the wiring board (10) is connected to the conductive post (35) by solder (120). The conductive post (35) is formed on top of the mounting pattern (25) of the first conductive layer (30) in a three-layer structure composed of the metal layer (32), the first metallic film (33), and the second metallic film (34). In addition, the conductive post (35) protrudes from a surface (first surface) of the resin insulating layer (20).

In the example shown in FIG. 2, the entire surface on the first conductive layer (30) side of the conductive post (35) is in contact with a surface of the mounting pattern (25). However, the present invention is not limited to this. Instead, the surface on the first conductive layer (30) side of the conductive post (35) may, for example, have a portion not in contact with the surface of the mounting pattern (25) of the first conductive layer (30), i.e., a portion jutting out past the mounting pattern (25). However, the conductive post (35) is preferably kept entirely within the surface of the mounting pattern (25) in a plan view, given that this makes neighboring conductive posts (35) unlikely to touch each other due to the solder (120) or the like.

The conductive post (35) is not embedded in the resin insulating layer (20) and protrudes therefrom; therefore, the conductive post (35) is not completely bound to the wiring board (10) and so has a comparatively high degree of freedom to deform (for example, to expand and contract). Therefore, after the electronic component is mounted on the wiring board (10), even when warping repeatedly develops in the wiring board (10) due to a change in ambient temperature or the like, functionality as a stress alleviator can be obtained for stress developing in a joint portion between the electrode (110) of the electronic component (100) and the mounting pattern (25). Accordingly, stress developing in the joint portion joining the electrode (110) of the electronic component (100) and the mounting pattern (25) (for example, in the solder (120)) is alleviated. As a result, deterioration of the solder (120) is inhibited and reliability of the connection between the wiring board (10) and the electronic component (100) is improved.

In addition, in the wiring board (10) of the present embodiment, by forming the conductive post (35) on top of the mounting pattern (25), the electrode (110) of the electronic component (100) is more readily connected to the mounting pattern (25) even when the surface of the first conductive layer (30) is lower than the first surface (F1) of the resin insulating layer (20) due to variations at the time the wiring board (10) was manufactured, or the like. Accordingly, a method not using a connection material such as the solder (120) to mount the electronic component (100) on the wiring board (10), e.g., a method such as copper-copper joining, is more readily employed. As a result, an electrical short circuit between electrodes (110) may be prevented even in an electronic component (100) having electrodes (110) at a narrow pitch.

Figure 3:
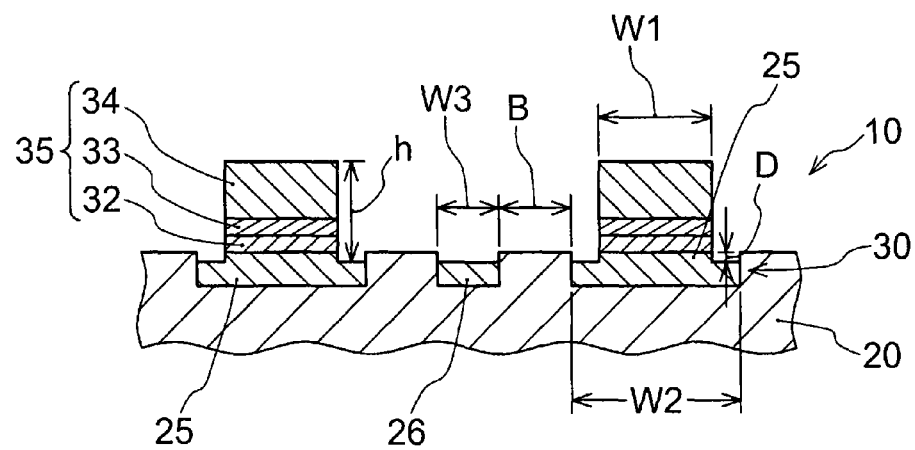
FIG. 3 is an expanded cross-sectional view of a modification of a mounting pattern for the printed wiring board shown in FIG. 1.

In this way, contact between the mounting pattern (25) and the electrodes of the electronic component may be made reliable using the conductive post (35). Therefore, as shown in FIG. 3, the surface of the mounting pattern (25) may be lower than the surface of the resin insulating layer (20) by design. In other words, the entire surface on the first conductive layer (30) side of the conductive post (35) may be formed to touch the surface of the mounting pattern (25), then the surface of the mounting pattern (25) not in contact with the conductive post (35) may be recessed further than the surface of the portion touching the conductive post (35) and the surface of the resin insulating layer (20). By adopting such a shape, a portion capable of comparatively free expansion and contraction relative to the wiring board (10) can be made longer. As a result, when warping develops in the wiring board (10), an action of alleviating stress that develops at the portion joined to the electrode of the electronic component is magnified and reliability of the connection between the electronic component and the wiring board (10) is further increased. Moreover, arranging the surface of the mounting pattern (25) lower than the surface of the resin insulating layer (20) in this way may be achieved in the method for manufacturing the wiring board (10) described hereafter by, for example, lengthening an amount of time that a portion around the metal layer (32) is etched.

FIG. 3 illustrates a wiring pattern (26), which is a portion of the first conductive layer and a portion not connected to the electrodes of the electronic component, arranged between two mounting patterns (25). In this way, the wiring pattern (26), which is not electrically connected to the electronic component, may also be provided to the wiring board (10) between portions of the mounting pattern (25). In addition, the wiring pattern (26) may be covered by the solder-resist (45) (see FIG. 1).

Preferred dimensions are provided below for the mounting pattern (25) and various portions in the vicinity thereof on the wiring board (10) according to the present embodiment. Moreover, reference symbols such as (W1) representing each portion are shown only in FIG. 3 as representative. However, preferred dimensions for each corresponding location on the mounting pattern (25) having the shape shown in FIG. 2 are similar to the dimensions given below. Preferably, a width (W1) of the conductive post (35) is between 10 and 30 µm; a width (W2) of the mounting pattern (25) is between 15 and 50 µm; a height (h) from the surface of the mounting pattern (25) to a top surface of the conductive post (35) is between 10 and 25 µm; a distance (B) between the mounting pattern (25) and the wiring pattern (26) is between 10 and 25 µm; a width (W3) of the wiring pattern (26) is between 8 and 25 µm; and a distance (D) from an interface between the metal layer (32) and the first conductive layer to the surface of the mounting pattern (25) is between 0.1 and 7 µm.

The first metallic film (33) forming the conductive post (35) of the wiring board (10) according to the present embodiment may be formed from various metals using any method. Preferably, the first metallic film (33) is a copper plating film formed by electroless plating. When the first metallic film (33) is formed by electroless plating, it is preferably formed to a thickness of between 0.3 and 1 µm, and more preferably between 0.4 and 0.8 µm.

Furthermore, in another preferred example, the first metallic film (33) is a copper sputter film formed by a sputtering method. When the first metallic film (33) is formed by a sputtering method, it is preferably formed to a thickness of between 0.05 and 0.2 µm, and more preferably between 0.1 and 0.15 µm.

The metal layer (32) forming the conductive post (35) is not particularly limited and may be formed by a metal of any quality, so long as the material is capable of forming the first metallic film (33) on top of the metal layer (32). The metal layer (32) is preferably formed by a copper foil or nickel foil. In addition, the first conductive layer (30), which includes the mounting pattern (25), may be formed from any conductive material. The first conductive layer (30) is preferably a copper electroplating film formed by electroplating capable of forming a thick film in a short amount of time. Similarly, the second metallic film (34) forming the uppermost layer of the conductive post (35) may also be formed by a metal of any quality, and is preferably a copper electroplating film formed by electroplating.

The resin insulating layer (20) is formed by impregnating an insulating resin into a core material (not shown in the drawings). Glass fibers or aramid fibers may be used for the core material, for example, an epoxy resin or bismaleimide triazine resin (BT resin) may be used for the insulating resin, for example, and a filler or the like such as silica powder may be filled therein. Any material may be used to form the resin insulating layer (20), which may also be formed by only an insulating resin, without using a core material. The insulating resin layer (20) preferably uses a glass epoxy material in which epoxy resin is impregnated into glass fibers.

A material forming the solder-resist (45) is also not particularly limited, so long as the material has favorable solder resistance and insulating properties. Preferably, the solder-resist (45) is formed by a material in which between 40 and 70 wt. % of an inorganic filler (such as $SiO_2$) is impregnated into epoxy resin.

As shown in FIG. 1, in the present embodiment, the second conductive layer (40) formed on the second surface (F2) side of the resin insulating layer (20) is composed of three layers: a second metallic foil (41) on the second surface (F2) of the resin insulating layer (20), a third metallic film (42) formed on the second metallic foil (41), and a fourth metallic film (43) formed on the third metallic film (42). A material of the second metallic foil (41), as well as a material of the third and fourth metallic films (42, 43), is not particularly limited. However, preferably, the second metallic foil (41) is composed of copper; the third metallic film (42) is a copper plating film formed by an electroless plating method or a copper sputter film formed by a sputtering method; and the fourth metallic film (43) is a copper plating film formed by electroplating.

As illustrated in FIG. 1, a portion of the second conductive layer (40) is covered by a second solder-resist (48). The second solder-resist (48) is preferably formed by the same material as the solder-resist (45) on the first surface (F1) side of the resin insulating layer (20), but is not limited to this. In FIG. 1, the second solder-resist (48) is formed so as to include an opening on the via conductor (38). However, the second solder-resist (48) may also cover the entire second conductive layer (40), or may be formed to include openings in more portions.

The via conductor (38) electrically connecting the first conductive layer (30) and the second conductive layer (40) is formed by the third metallic film (42) and the fourth metallic film (43), which are formed on an interior surface of a hole for conductor (37) provided to the resin insulating layer (20). In the example shown in FIG. 1, the hole for conductor (37) is fully filled in by the third and fourth metallic films (42, 43); however, the present invention is not limited to this, and the hole for conductor (37) may instead not be fully filled in. In addition, in FIG. 1, the via conductor (38) is shown having a shape with a diameter increasing from the first surface (F1) side of the resin insulating layer (20) toward the second surface (F2) side. However, the via conductor (38) is not limited to this, and may instead have the same size on the first surface (F1) side and the second surface (F2) side, for example, or may increase in diameter from the second surface (F2) side toward the first surface (F1) side.

In the present embodiment, as shown in FIG. 1, multiple conductive posts (35) are exposed by one opening (46) in the solder-resist (45). However, as shown in FIG. 4, each of the conductive posts (35) may be individually exposed by a respective opening (47) in multiple openings (47) in the solder-resist (45).

Figure 4:
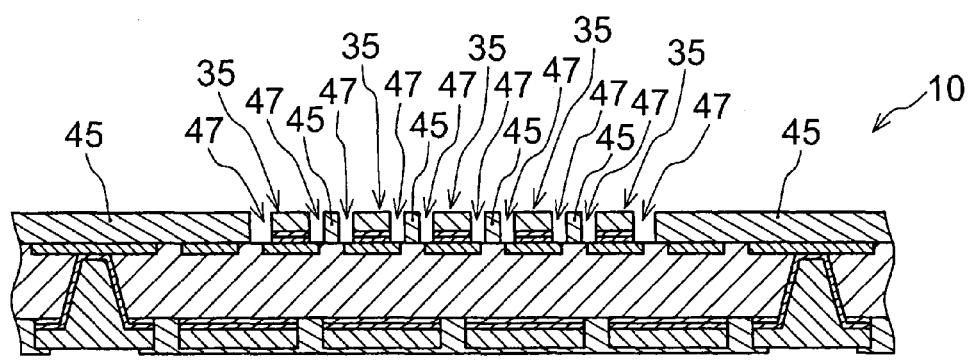
FIG. 4 is a cross-sectional view illustrating an example in which an opening in a solder-resist is provided for each mounting pattern in the printed wiring board according to the first embodiment of the present invention.

Moreover, in FIG. 4, the surface of the solder-resist (45) is shown at the same height as the surface of the conductive post (35); however, each may have a respectively different height. A conductive post (35) whose surface is positioned higher than the solder-resist (45) is preferable in that even when the surface of the electrode (110) (see FIG. 2) of the electronic component (100) (see FIG. 2) mounted on the wiring board (10) is coplanar with the surface of the portion around the electrode (110), contact is readily made between the conductive post (35) and the electrode (110). In addition, the solder-resist (45) whose surface is positioned higher than the conductive post (35) is preferable in that contact between neighboring conductive posts (35) due to solder or the like may be prevented effectively.

Next, a method for manufacturing the wiring board (10) according to a first embodiment of the present invention is described with reference to FIGS. 5 and 6A through 6H. First, in a step represented as S11 in FIG. 5, and as illustrated in FIG. 6A, a carrier (50) and a first metallic foil (32a) attached to a carrier copper foil (50a) are prepared as starting materials, the first metallic foil (32a) attached to the carrier copper foil (50a) is oriented such that the carrier copper foil (50a) side is toward the carrier (50) and is laminated onto both surfaces of the carrier (50), then the foil is pressurized and heated to join it to the carrier (50). Preferably, a semi-cured prepreg material or the like is used as the carrier (50), the semi-cured prepreg material being composed of a material in which, for example, an insulating resin such as epoxy is impregnated into a core material such as glass fibers. However, the present invention is not limited to this and other materials may also be used. The first metallic foil (32a) is not particularly limited, so long as the first metallic film (33) (described hereafter) can be formed on the surface thereof, but copper foil or nickel foil is preferably used. In addition, the first metallic foil (32a) may employ a metallic foil having, for example, a thickness of between 2 and 6 µm, and preferably between 3 and 5 µm. In addition, the carrier copper foil (50a) may employ a copper foil having, for example, a thickness of between 15 and 30 µm, and preferably between 17 and 22 µm. However, the thickness of the first metallic foil (32a) and the carrier copper foil (50a) is not limited to this and may be set to some other thickness.

The carrier copper foil (50a) and the first metallic foil (32a) are, for example, adhered to each other on substantially an entire adhesion surface by a thermoplastic adhesive not shown in the drawings. However, the present invention is not limited to this, and the carrier copper foil (50a) and first metallic foil (32a) may also be joined to each other by an adhesive or ultrasonic weld on a blank portion near an outer periphery of the first conductive layer (30) (see FIG. 6B) where a predetermined conductor pattern is not provided.

In the example shown in FIG. 6A, the first metallic foil (32a) to which the carrier copper foil (50a) has already been attached is shown being joined to the carrier (50), which is composed of a single prepreg material. However, the present invention is not limited to this structure and may instead, for example, use a double-sided copper-clad laminate board as the carrier (50) and join a single first metallic foil (32a) on top of each of the copper foils pre joined to the two surfaces of the laminate board, the first metallic foil (32a) being joined using an adhesive or the like. The carrier (50) may also be formed by any other plate-shaped member having an appropriate degree of rigidity.

Moreover, FIG. 6A to 6D illustrate an exemplary manufacturing method in which the first metallic foil (32a) is adhered to surfaces on both sides of the carrier (50) and the wiring board (10) is formed on each surface. When the wiring board (10) is formed on both sides of the carrier (50) in this way, two wiring boards (10) are produced at once, which is preferred. However, the wiring board (10) may also be formed on only one surface of the carrier (50), or wiring boards having different circuit patterns may be formed on each of the two sides. The following description of the method for manufacturing the wiring board (10) is given with reference to FIG. 6A to 6D, which illustrate an example in which the same circuit pattern is formed on both surfaces. Therefore, only one surface is described and a description of the other surface as well as reference numerals for the other surface in the drawings are omitted.

Figure 5:
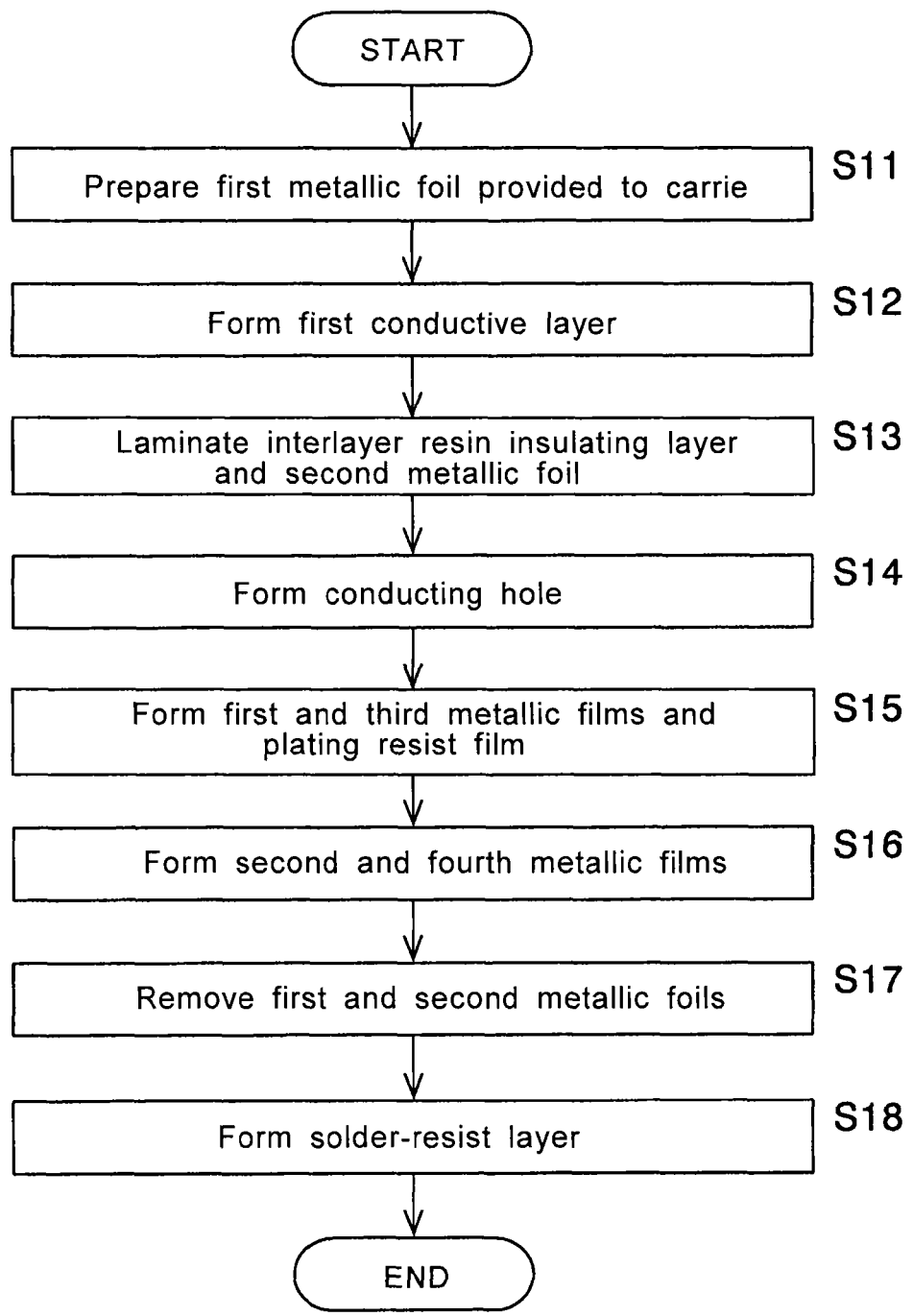
FIG. 5 is a flow chart of a method for manufacturing the printed wiring board shown in FIG. 1.
Figure 6A:
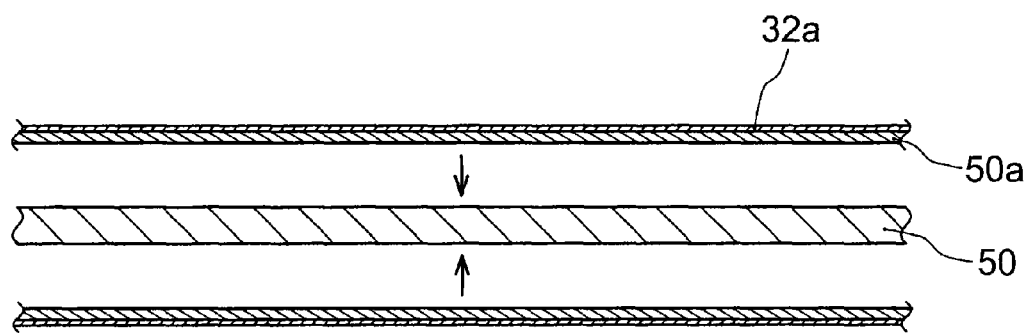
FIG. 6A is an explanatory diagram of a step in the method for manufacturing the printed wiring board shown in FIG. 1.
Figure 6B:
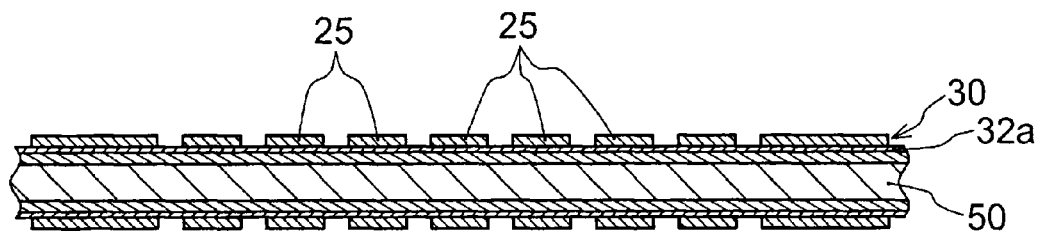
FIG. 6B is an explanatory diagram of a step in the method for manufacturing the printed wiring board shown in FIG. 1.

Next, in a step represented as S12 in FIG. 5, and as illustrated in FIG. 6B, the first conductive layer (30) is formed on the first metallic foil (32a). Specifically, a plating resist film is first formed on the first metallic film (32a), the plating resist film having openings at predetermined positions that include portions where the mounting pattern (25) is to be formed. Next, an electroplating film is formed at the openings in the plating resist film using electroplating with the first metallic film (32a) as a seed layer. Thereafter, the plating resist layer is removed. As a result, as shown in FIG. 6B, the first conductive layer (30), which includes the mounting pattern (25), is formed on the first metallic foil (32a). The first conductive layer (30) is preferably an electroplating film composed of copper.

Figure 6C:
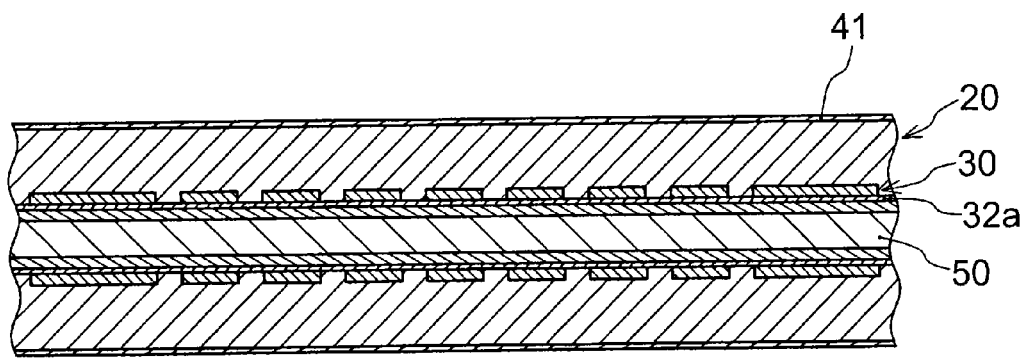
FIG. 6C is an explanatory diagram of a step in the method for manufacturing the printed wiring board shown in FIG. 1.

Next, in a step represented as S13 in FIG. 5, and as illustrated in FIG. 6C, a laminate body composed of the semi-cured resin insulating layer (20) and the second metallic foil (41) is laminated on top of the first metallic foil (32a) and the first conductive layer (30). After this, the second metallic foil (41) and the resin insulating layer (20) are pressed toward the carrier (50) and are further heated. As a result, the resin insulating layer (20) is fully cured and, at the same time, the first metallic foil (32a), the first conductive layer (30), and the second metallic foil (41) are joined. The resin insulating layer (20) is formed by a core material (not shown in the drawings) and an insulating resin, for example, but is not limited to this. The resin insulating layer (20) may instead be formed only by the insulating resin, without the core material.

Figure 6D:
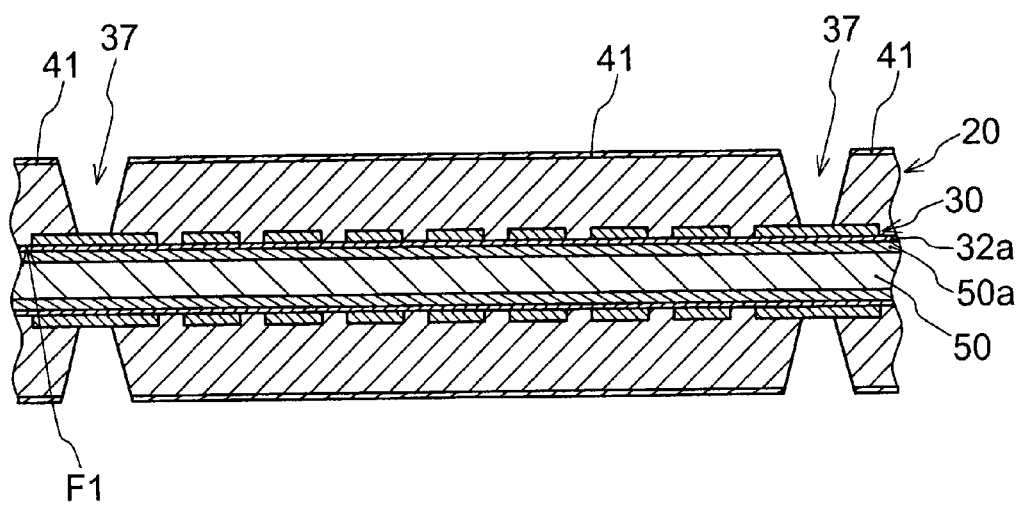
FIG. 6D is an explanatory diagram of a step in the method for manufacturing the printed wiring board shown in FIG. 1.

Next, in a step represented as S14 in FIG. 5, and as illustrated in FIG. 6D, the hole for conductor (37) is formed penetrating through the second metallic foil (41) and the resin insulating layer (20) and exposing the first conductive layer (30). Specifically, using a $CO_2$ laser, laser light is fired at a predetermined position on the second metallic foil (41) from a surface side of the second metallic foil (41). As a result, the hole for conductor (37) is formed as shown in FIG. 6D. After the hole for conductor (37) is formed, the hole for conductor (37) is preferably desmeared. In addition, the surface of the second metallic foil (41) may also be blackened prior to laser exposure in order to increase laser light absorption efficiency.

After this, the carrier (50) and the carrier copper foil (50a) are removed. Specifically, for example, the carrier copper foil (50a) and the first metallic foil (32a) are separated from each other in a state where the thermoplastic adhesive (not shown in the drawings) joining the two foils is heated and softened. After the two foils are separated, a separation surface of the first metallic foil (32a) may be cleaned by a predetermined solvent. In addition, as noted above, in a case where the two foils are joined by an adhesive or ultrasonic welding in a blank portion near the outer periphery thereof, the carrier copper foil (50a), the first metallic foil (32a), and the carrier (50) may be cut away on a side closer to an inner periphery than the joining location, excising the joined location, and the carrier copper foil (50) and the carrier (50) may be separated from the first metallic foil (32a). As a result, the first metallic foil (32a) is exposed on the first surface (F1) side of the resin insulating layer (20).

Figure 6E:
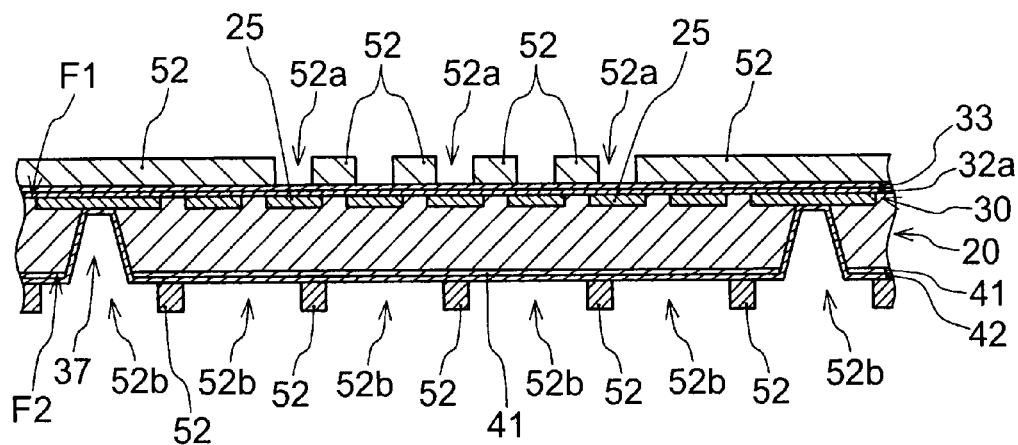
FIG. 6E is an explanatory diagram of a step in the method for manufacturing the printed wiring board shown in FIG. 1.

Next, in a step represented as S15 in FIG. 5, and as illustrated in FIG. 6E, the first metallic film (33) is formed on top of the first metallic foil (32a) and the third metallic film (42) is formed on top of the second metallic foil (41) and inside the hole for conductor (37). Moreover, in FIG. 6E to 6H, in order to facilitate understanding of the steps for manufacturing the wiring board (10) from S15 on, the wiring board during the manufacturing steps is illustrated in a state rotated 180° on a rotation axis perpendicular to each drawing plane from the orientation illustrated in FIG. 6A to 6D. In addition, the carrier (50) has already been removed, and thus only one wiring board (10) undergoing manufacture is illustrated in each of FIG. 6E to 6H.

The first and third metallic films (33, 42) are preferably formed by deposition of copper using electroless plating. In the case where the first and third metallic films (33, 42) are formed by electroless plating, the films are preferably formed to be thin plating films having a thickness of between 0.3 and 1 μm.

In another preferred example, the first and third metallic films (33, 42) are formed by vapor deposition of copper using a sputtering method. In the case where the first and third metallic films (33, 42) are formed by a sputtering method, the films are preferably formed to be extremely thin sputter films having a thickness of between 0.05 and 0.2 μm. The materials for and method of forming the first and third metallic films (33, 42) are not limited to these, and the films may instead be formed by some other method and materials.

Next, as shown in FIG. 6E, a plating resist film (52) is formed on top of the first and third metallic films (33, 42). On the first surface (F1) side of the resin insulating layer (20), the plating resist film (52) is formed on top of the first metallic film (33) in areas excluding at least a portion above a predetermined portion of the first conductive layer (30). In other words, an opening (52a) is provided to the plating resist film (52) on the first surface (F1) side of the resin insulating layer (20), the opening (52a) exposing the first metallic film (33) above the predetermined portion of the first conductive layer (30). The opening (52a) is provided at least above the mounting pattern (25). In addition, on the second surface (F2) side of the resin insulating layer (20), the plating resist film (52) is formed on top of the third metallic film (42) in areas excluding at least the portion above a predetermined portion and the hole for conductor (37). In other words, an opening (52b) is provided to the plating resist film (52) on the second surface (F2) side of the resin insulating layer (20), the opening (52b) exposing the hole for conductor (37) and the third metallic film (42) above the predetermined portion. The opening (52b) is provided to at least a portion above the resin insulating layer (20) in a portion where the second conductive layer (described below; see FIG. 6G) is formed.

Figure 6F:
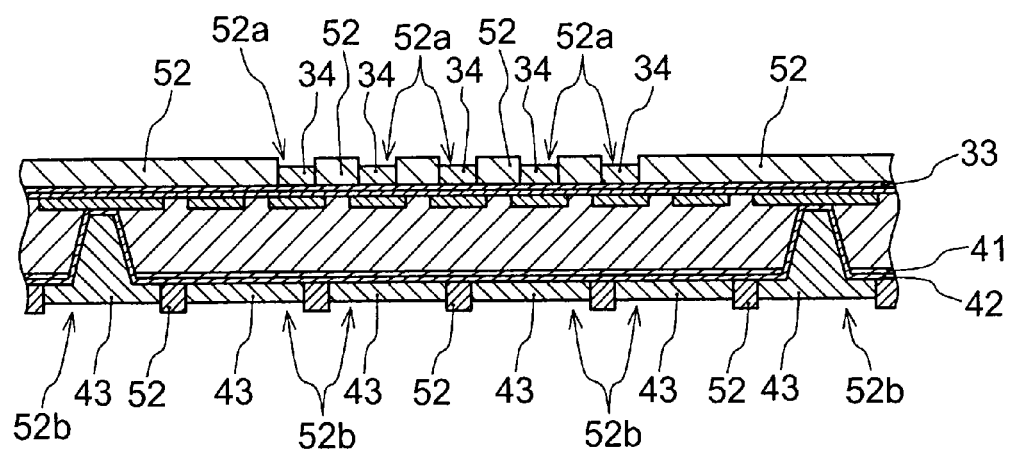
FIG. 6F is an explanatory diagram of a step in the method for manufacturing the printed wiring board shown in FIG. 1.

Next, in a step represented as S16 in FIG. 5, and as illustrated in FIG. 6F, the second and fourth metallic films (34, 43) are formed on a portion not covered by the plating resist film (52), i.e., within the openings (52a, 52b) of the plating resist film (52). In FIG. 6F, the hole for conductor (37) is filled by the fourth metallic film (43). However, the hole for conductor (37) may also not be fully filled in, and instead a recess may be formed in the surface of the fourth metallic film (43). In the present embodiment, the second and fourth metallic films (34, 43) are electroplating conductive layers formed by electroplating; however, the present invention is not limited to this and the second and fourth metallic films (34, 43) may be formed by some other method. The second and fourth metallic films (34, 43) are preferably formed by copper, but are not limited to this and may instead be formed by another metal material.

Figure 6G:
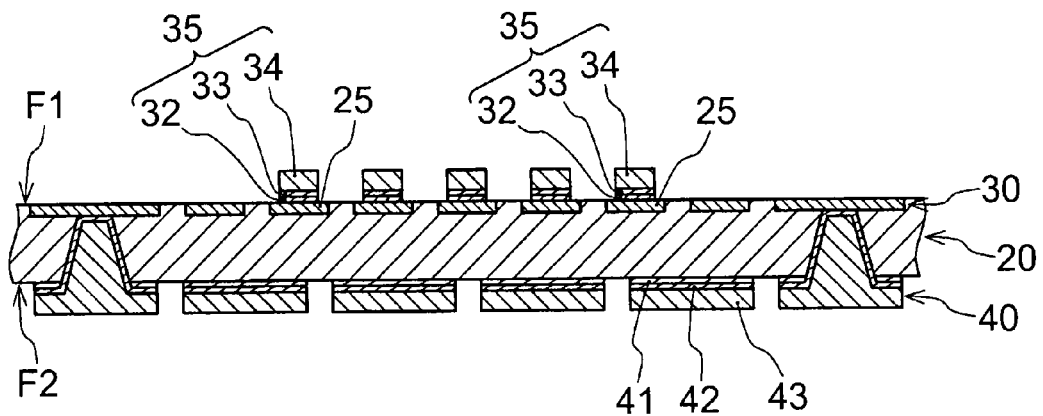
FIG. 6G is an explanatory diagram of a step in the method for manufacturing the printed wiring board shown in FIG. 1.

Next, in a step represented as S17 in FIG. 5, a portion of the first and third metallic films (33, 42) and a portion of the first and second metallic foils (32a, 41) are removed. Specifically, the plating resist film (52) is peeled away first. Next, the first and third metallic films (33, 42) exposed by peeling away the plating resist film (52) are removed by etching or the like. Next, in portions where the first and third metallic films (33, 42) have been removed, the exposed first and second metallic foils (32a, 41) are removed. As a result, as shown in FIG. 6G, the mounting pattern (25) and the conductive post (35) are formed on the first surface (F1) side of the resin insulating layer (20), the mounting pattern (25) being a portion of the first conductive layer (30) and the conductive post (35) protruding from the first surface (F1) of the resin insulating layer (20). At the same time, the second conductive layer (40) is formed on the second surface (F2) side of the resin insulating layer, the second conductive layer (40) having a conductor pattern composed of the second metallic foil (41) and the third and fourth metallic films (42, 43).

In this way, in the method for manufacturing the wiring board (10) according to the present embodiment, the second conductive layer (40) and the conductive post (35), to which the electronic component (100) (see FIG. 6H) is connected, may be formed by simultaneously performing identical processes in the steps represented as S15 to S17 in FIG. 5. In other words, simply by completing the steps S15 to S17 one time, both the conductive post (35) and the second conductive layer (40) can be created simultaneously. Therefore, a printed board (10) can be efficiently manufactured that has a high degree of reliability in a connection with the electronic component (100) and in which reliable contact can be readily established with the electronic component (100) without use of a bonding material.

In the method for manufacturing the wiring board (10) according to the present embodiment, the conductive post (35) is formed on top of the mounting pattern (25), which is a portion of the first conductive layer (30), in a three-layer structure composed of the metal layer (32), which is a portion of the first metallic foil (32a) (see FIG. 6E) that is left behind and not removed by step S17, described above; the first metallic film (33); and the second metallic film (34) which, in the present embodiment, is an electroplating conductive layer.

Moreover, in step S15 described above, the plating resist film (52) (see FIG. 6E) is formed such that the opening (52a) does not jut out from the mounting pattern (25), which is a portion of the first conductive layer (30), and as a result, as shown in FIG. 6G, the entire surface of the conductive post (35) on the first conductive layer (30) side is formed so as to be in contact with the surface of the mounting pattern (25).

In addition, when a portion of the first and second metallic foils (32a, 41) are removed by etching in step S17, described above, at least a portion of the surface of the mounting pattern (25) not in contact with the conductive post (35) may be removed together with the removed portion of the first metallic foil (32a) by adjusting an amount of etching time. As a result, as shown in FIG. 3, the portion of the surface of the mounting pattern (25) not in contact with the conductive post (35) may be formed so as to be recessed further than the surface of the portion in contact with the conductive post (35) and further than the surface of the resin insulating layer (20).

Figure 6H:
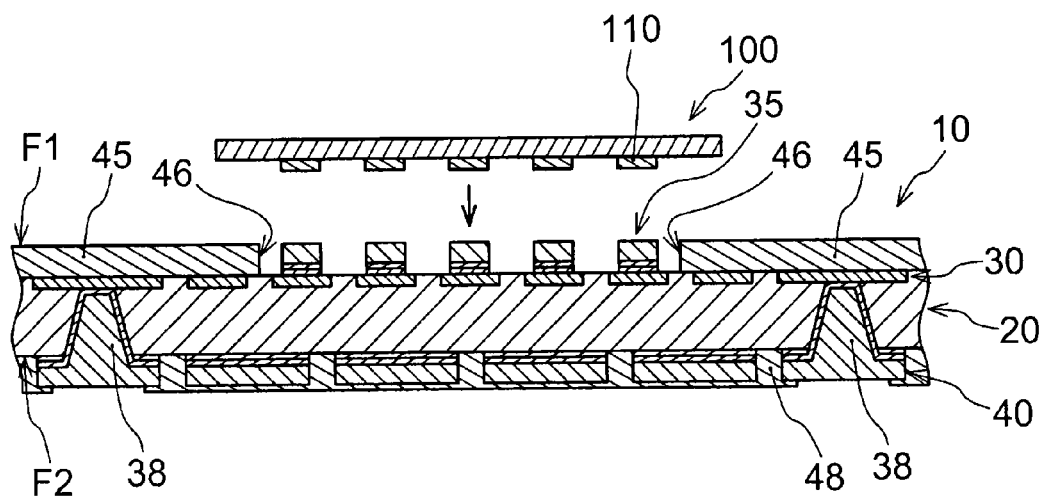
FIG. 6H is an explanatory diagram of a step in the method for manufacturing the printed wiring board shown in FIG. 1.

In step S17 described above, the conductive post (35) is formed and the second conductive layer (40) is patterned, after which, in a step represented as S18 in FIG. 5, and as illustrated in FIG. 6H, the solder-resist (45) may be formed on top of the first conductive layer (30) and the first surface (F1) side of the resin insulating layer (20) and, simultaneously, the second solder-resist (48) may be formed on top of the second conductive layer (40) and the second surface (F2) of the resin insulating layer (20).

For example, a photosensitive epoxy or the like is formed on the entire surfaces of the first surface (F1) and the second surface (F2) of the resin insulating layer (20), after which the epoxy above locations where solder-resist is provided is exposed to light, and epoxy in portions not exposed to light is removed by development to form the solder-resist (45) and the second solder-resist (48). However, the present invention is not limited to this, and the solder-resist (45) and second solder-resist (48) may instead be provided using some other method such as screen printing, which employs a mask open at portions corresponding to the locations where the solder-resist is provided.

In the method for manufacturing the wiring board (10) according to the present embodiment, as shown in FIG. 6H, the conductive post (35) is not covered by the solder-resist (45) and instead is left exposed in one of the openings (46), which is formed by removing a portion of the solder-resist (45). However, in addition to this, the first conductive layer (30) in a portion where the conductive post (35) is not formed may also be left exposed. In addition, an opening is provided to the second solder-resist (48) so as to expose the second conductive layer (40) on the via conductor (38). However, the present invention is not limited to this. Still more predetermined portions of the second conductive layer (40) may be exposed and not covered by the second solder-resist (48), or the entire second conductive layer (40) may be covered by the second solder-resist (48). In addition, in the step of forming the solder-resist (45), for example, the photosensitive epoxy above the portion between neighboring portions of the mounting pattern (25) is exposed to light, then is left in place instead of being removed. As a result, as shown in FIG. 4, each of the conductive posts (35) may be individually exposed to a respective opening (47) of the openings (47) in the solder-resist (45). In addition, the solder-resist (45) and the second solder-resist (48) may be formed on the entire surface of the first surface (F1) or the second surface (F2) of the resin insulating layer (20) by a non-photosensitive epoxy, for example, and multiple openings formed in each by a laser.

In addition, a corrosion-resistant layer (not shown in the drawings) composed of Ni/Au, Ni/Pd/Au, or Sn, for example, may be formed on the conductive post (35) not covered and left exposed by the solder-resist (45) and second solder-resist (48), and on the surfaces of the first and second conductive layers (30, 40). Further, a corrosion-resistant layer (not shown in the drawings) composed of an organic protective film (OSP) may also be formed by dipping in a liquid protective material, spraying a protective material, or the like; or a solder coat layer (not shown in the drawings) may be formed.

By completing the steps S11 to S18 described above, the wiring board (10) according to the embodiment shown in FIGS. 1 and 6H is completed. Moreover, as shown in FIG. 6H, the electronic component (100), for example, is mounted on the completed wiring board (10).

The method for manufacturing the wiring board (10) according to the present embodiment is not limited to the method described with reference to FIGS. 5 and 6A to 6H. The conditions, order of steps, and the like of the method may be modified as desired. In addition, specific steps may be omitted and other steps may be added. For example, after the hole for conductor (37) is formed as shown in FIG. 6D, prior to separating the carrier copper foil (50a) and the first metallic foil (32a), an additional group or multiple groups of insulating resin layers and conductive layers may be provided to both sides of the carrier (50). Specifically, beginning with the state shown in FIG. 6D, using steps similar to those represented by S15 to S17 in FIG. 5, formation of a fifth and sixth metallic film on top of the second metallic foil and removal of a portion of the second metallic foil may be performed and, still further, similar to the steps represented by S13 and S14 in FIG. 5, a second resin insulating layer and a third metallic foil may be laminated and a hole for conductor formed in the second resin insulating layer, after which the carrier (50) and the carrier copper foil (50a) may be removed and the steps from the step shown in FIG. 6E onward performed. In this way, a desired number of resin insulating layers and conductive layers may be formed on a side where the first conductive layer (30) of the resin insulating layer (20) is not filled in.

In recent years, demand for a reduction in size of electronic devices has risen progressively and, alongside this demand, a higher wiring density has been sought for wiring boards used in the electronic devices. A wiring board in which a pre-formed wiring pattern is embedded in an insulating layer has been proposed as a wiring board capable of forming a high-density wiring pattern.

In wiring boards having a conductor pattern embedded inside an insulating material, such as described in Japanese Patent Laid-open Publication No. H10-173316 and Japanese Patent Laid-open Publication No. 2004-311804, there is a tendency for the insulating layer to become thinner so as to meet a demand for reducing thickness in addition to reducing size. In addition, in a case where a large electronic component is mounted to one surface, for example, a disparity between a first and second surface of the insulating layer readily arises in a region filled with solder-resist formed on the surface of the insulating layer. Therefore, the wiring board is likely to warp. When the wiring board develops warping, stress develops in a location joining an electrode of the electronic component and a mounting pattern that is part of the conductor pattern of the wiring board and is connected to the electrode of the electronic component. Moreover, displacement due to warping of the insulation layer or the like when the mounting pattern is embedded in the insulation layer is readily transmitted in full to the joint location. The joint location therefore degrades, and reliability of a connection between the electronic component and the wiring board may decrease.

In addition, when the mounting pattern is embedded in the insulation layer, a joining material such as solder connecting the electrode of the electronic component with the mounting pattern is likely to spread horizontally, and the joining material of neighboring electrodes becomes likely to touch. Such contact may be avoided if the electrode of the electronic component and the mounting pattern of the wiring board are directly connected without using a joining material. However, when the mounting pattern is embedded in the insulating layer, a surface of the mounting pattern is substantially coplanar with a surface of the insulating layer, and therefore there is a possibility that the surface of the mounting pattern may be lower than the surface of the insulating layer due to variations at the time of manufacture. In such a case, when no joining material is used, it is difficult to achieve reliable contact between the electrode of the electronic component and the mounting pattern of the wiring board.

A method according to an embodiment of the present invention is capable of efficiently manufacturing a printed wiring board with a conductive post having favorable reliability of a connection with an electronic component even when a conductor pattern is embedded in an insulating layer, and capable of reliably connecting to the electronic component without using a joining material. Another embodiment of the present invention is such a printed wiring board with conductive posts.

A method for manufacturing a printed wiring board with conductive posts according to an embodiment of the present invention includes: preparing a first metallic foil provided to a carrier; forming a first conductive layer on the first metallic foil, the first conductive layer including a mounting pattern connecting to an electronic component via conductive posts; laminating a resin insulating layer and a second metallic foil onto the first metallic foil and the first conductive layer; forming a hole for conductor penetrating through the second metallic foil and the resin insulating layer and exposing the first conductive layer; removing the carrier and exposing the first metallic foil; forming a metal film onto the first metallic foil and the second metallic foil inside the hole for conductor; forming a plating resist film on the metal film except at least on the mounting pattern, inside the hole for conductor, and a portion of a second conductive layer formed on the second metallic foil side of the resin insulating film; forming an electroplating conductive layer using electroplating on a portion not covered by the plating resist film and inside the hole for conductor; removing the plating resist film; and applying etching removal on the metal film exposed by removing the plating resist film as well as on the first metallic foil and second metallic foil below the metal film to form the conductive posts on the mounting pattern.

A printed wiring board with conductive posts according to an embodiment of the present invention includes a resin insulating layer having a first surface and a second surface on the opposite side from the first surface; a first conductive layer embedded into the first surface of the resin insulating layer such that an uppermost surface is exposed, the first conductive layer being electrically connected to an electronic component having an electrode; a second conductive layer formed on the second surface of the resin insulating layer; a via conductor provided running through the resin insulating layer and electrically connecting the first conductive layer with the second conductive layer; and a solder-resist formed on the first surface of the resin insulating layer and on the first conductive layer, the solder-resist including an opening exposing a portion of the first conductive layer electrically connected to the electrode of the electronic component. In addition, the conductive posts are formed on the first conductive layer, the uppermost layer of which is exposed via the opening, and the conductive posts protrude from the surface of the resin insulating layer.

With a printed wiring board having the conductive posts according to an embodiment of the present invention, stress developing at a joint portion between the printed wiring board and the electronic component can be alleviated by the conductive posts protruding from the surface of the resin insulating layer. In addition, reliable contact between the electrode of the electronic component and the mounting pattern of the printed wiring board can be achieved with the conductive posts even without using a joining material. Moreover, with a method for manufacturing the printed wiring board with the conductive posts according to an embodiment of the present invention, formation of the conductive posts protruding from one surface of the resin insulating layer can be performed at the same time as patterning of the conductive layer on the other surface of the resin insulating layer. Therefore, it is possible to efficiently manufacture a printed wiring board with a conductive post having a high degree of reliability for a connection with the electronic component, and in which a short circuit between electrodes of the electronic component is unlikely to occur.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a printed wiring board, comprising:
   forming a first conductive layer on a first metallic foil provided on a carrier such that the first conductive layer includes a mounting pattern positioned to connect an electronic component via a plurality of conductive posts;
   forming on the first metallic foil a laminate structure comprising a resin insulating layer and a second metallic foil such that the first conductive layer is embedded into a surface of the resin insulating layer;
   forming a hole for a via conductor through the laminate structure such that the hole exposes the first conductive layer;
   removing the carrier from the first metallic foil such that the first metallic foil is exposed;
   forming a metal film on the laminate structure and the first metallic film such that the metal film is formed on the first metallic foil, on the second metallic foil and inside the hole;
   forming a plating resist film on the metal film such that the plating resist film has a pattern exposing portion of the metal film substantially corresponding to the mounting pattern, the hole and portion of the second metallic foil for forming a second conductive layer on the resin insulating film;
   applying electroplating on the portion of the metal film exposed by the pattern of the plating resist film such that an electroplating conductive layer is formed on the portion of the metal film not covered by the plating resist film;
   removing the plating resist film from the metal film such that portion of the metal film below the plating resist film are exposed; and
   applying etching removal on the portion of the metal film exposed by the removing of the plating resist film such that portion of the first metallic foil and second metallic foil below the portion of the metal film exposed by the removing of the plating resist film is removed and that the plurality of conductive posts protruding from the surface of the resin insulating layer is formed on the mounting pattern,
   wherein the applying of etching removal comprises applying of etching removal such that the surface of the mounting pattern of the first conductive layer has portions being in contact with the conductive posts and portions not being in contact with the conductive posts and recessed with respect to the portions being in contact with the conductive posts and the surface of the resin insulating layer, each of the conductive posts has a three layer structure comprising a metal layer formed on the first conductive layer, a first metal film formed on the metal layer, and a second metal film formed on the first metal film, the first conductive layer comprises an electroplating film, the metal layer is one of a copper foil and a nickel foil, the first metal film is one of an electroless plating film and a sputter film, and the second metal film is an electroplating film formed such that the electroplating film has a thickness which is greater than a thickness of the metal layer and a thickness of the first metal film.

2. A method for manufacturing a printed wiring board according to claim 1, wherein the forming of the metal film comprises applying electroless plating of copper such that the metal film comprising a copper plating film is formed in a thickness in a range of 0.3 µm to 1 µm.

3. A method for manufacturing a printed wiring board according to claim 1, wherein the forming of the metal film comprises sputtering copper such that the metal film comprising a copper sputter film is formed in a thickness in a range of 0.05 µm to 0.2 µm.

4. A method for manufacturing a printed wiring board according to claim 1, wherein the forming of the plating resist film comprises forming the plating resist film having the pattern such that an entire end surface of each of the conductive posts on a first conductive layer side makes contact with a surface of the mounting pattern of the first conductive layer.

5. A method for manufacturing a printed wiring board according to claim 1, wherein the first conductive layer comprises electroplating material, and the first metallic foil is one of a copper foil and a nickel foil.

6. A method for manufacturing a printed wiring board according to claim 1, wherein the plurality of conductive posts and the second conductive layer are formed in a same process.

7. A printed wiring board, comprising:
a resin insulating layer;
a first conductive layer embedded into a first surface of the resin insulating layer such that the first conductive layer has an uppermost surface exposed on the first surface of the resin insulating layer and includes a mounting pattern formed to be electrically connected to an electronic component having a plurality of electrodes;
a second conductive layer formed on a second surface of the resin insulating layer on an opposite side of the resin insulating layer with respect to the first surface;
a via conductor formed through the resin insulating layer such that the via conductor is electrically connecting the first conductive layer and the second conductive layer;
a solder-resist layer formed on the first surface of the resin insulating layer such that the solder-resist layer is formed on the first conductive layer and has an opening structure extending to a plurality of portions of the first conductive layer and exposing the plurality of portions of the first conductive layer; and
a plurality of conductive posts formed in the opening structure of the solder-resist layer such that the plurality of conductive posts is positioned to connect the first conductive layer to the electrodes of the electronic component and is protruding from the first surface of the resin insulating layer,
wherein the surface of the mounting pattern of the first conductive layer has portions being in contact with the conductive posts and portions not being in contact with the conductive posts and recessed with respect to the portions being in contact with the conductive posts and the first surface of the resin insulating layer, each of the conductive posts has a three layer structure comprising a metal layer formed on the first conductive layer, a first metal film formed on the metal layer, and a second metal film formed on the first metal film, the first conductive layer comprises an electroplating film, the metal layer is one of a copper foil and a nickel foil, the first metal film is one of an electroless plating film and a sputter film, and the second metal film is an electroplating film formed such that the electroplating film has a thickness which is greater than a thickness of the metal layer and a thickness of the first metal film.

8. A printed wiring board according to claim 7, wherein the first metal film comprises a copper plating film comprising electroless plating material and having a thickness in a range of 0.3 µm to 1 µm.

9. A printed wiring board according to claim 7, wherein the first metal film comprises a copper sputter film comprising sputter material and having a thickness in a range of 0.05 µm to 0.2 µm.

10. A printed wiring board according to claim 7, wherein each of the conductive posts has an entire end surface on a first conductive layer side in contact with a surface of the mounting pattern of the first conductive layer.

11. A printed wiring board according to claim 10, wherein the first metal film comprises a copper plating film comprising electroless plating material and having a thickness in a range of 0.3 µm to 1 µm.

12. A printed wiring board according to claim 10, wherein the first metal film comprises a copper sputter film comprising sputter material and having a thickness in a range of 0.05 µm to 0.2 µm.

13. A printed wiring board according to claim 10, wherein the three layer structure of each of the conductive posts has a height in a range of 10 µm to 25 µm, and the first metal film comprises a copper plating film comprising electroless plating material and having a thickness in a range of 0.3 µm to 1 µm.

14. A printed wiring board according to claim 10, wherein the three layer structure of each of the conductive posts has a height in a range of 10 µm to 25 µm, and the first metal film comprises a copper sputter film comprising sputter material and having a thickness in a range of 0.05 µm to 0.2 µm.

15. A printed wiring board according to claim 10, wherein the three layer structure of each of the conductive posts has a height in a range of 10 µm to 25 µm, the metal layer has the thickness in a range of 2 µm to 6 µm, and the first metal film comprises a copper plating film comprising electroless plating material and having a thickness in a range of 0.3 µm to 1 µm.

16. A printed wiring board according to claim 10, wherein the three layer structure of each of the conductive posts has a height in a range of 10 µm to 25 µm, the metal layer has the thickness in a range of 2 µm to 6 µm, and the first metal film comprises a copper sputter film comprising sputter material and having a thickness in a range of 0.05 µm to 0.2 µm.

17. A printed wiring board according to claim 10, wherein the solder-resist layer is formed on the first surface of the resin insulating layer such that the opening structure comprises a plurality of opening portions exposing the plurality of conductive posts, respectively.

18. A printed wiring board according to claim 10, wherein the solder-resist layer is formed on the first surface of the resin insulating layer such that the opening structure comprises one opening portion exposing the plurality of conductive posts.

19. A printed wiring board according to claim 7, wherein the solder-resist layer is formed on the first surface of the resin insulating layer such that the opening structure comprises a plurality of opening portions exposing the plurality of conductive posts, respectively.

20. A printed wiring board according to claim 7, wherein the solder-resist layer is formed on the first surface of the resin insulating layer such that the opening structure comprises one opening portion exposing the plurality of conductive posts.

* * * * *